United States Patent [19]

Rabjohn

[11] Patent Number: 4,853,624

[45] Date of Patent: Aug. 1, 1989

[54] TUNABLE MICROWAVE WAFER PROBE

[75] Inventor: Gordon G. Rabjohn, Kanata, Canada

[73] Assignee: Northern Telecom Limited, Montreal, Canada

[21] Appl. No.: 269,877

[22] Filed: Nov. 9, 1988

[30] Foreign Application Priority Data

Nov. 2, 1988 [CA] Canada .................................. 582047

[51] Int. Cl.[4] .......................... G01R 1/04; H01P 5/22
[52] U.S. Cl. .............................. 324/158 P; 324/158 F; 324/73 PC; 324/72.5; 333/246
[58] Field of Search ............... 324/72.5, 158 F, 158 P, 324/73 PC, 95; 333/246, 204, 205

[56] References Cited

U.S. PATENT DOCUMENTS 4,806,890 2/1989 Gurcan et al. ...................... 333/246

OTHER PUBLICATIONS

Rabjohn et al.; "High–Frequency Wafer Probing Techniques", Canadian Journal of Physics; vol. 65; pp. 850-855; 1987.
Lane; "Session XIII: Microwave Oscillators, Power Combiners and Measurement Techniques"; ISSCC 78/Thursday, Feb. 16, 1978/Continental Ballroom 6/4:15 PM; pp. 272-274.
Strid et al.; "A DC-12 GHZ Monolithic GaAsFET Distributed Amplifier"; IEEE Transactions on Electron Devices; vol. ED. 29, No. 7; Jul. 1982; pp. 1065-1071.
Gleason et al.; "Microwave Wafer Probing"; Microwave Journal; Jan. 1985; pp. 121-129.
Perlow; "New Algorithms for the Automated Microwave Tuner Test System"; RCA Review; vol. 46; Sep. 1985; pp. 341-355.
"An On Wafer Noise Parameter and S-Parameter Measurement System"; Microwave Journal; Sep. 1988; pp. 275-278.
"Introducing the World's First Microwave Wafer Probing Equipment"; Cascade Microtech; 1983-1985.

Primary Examiner—Reinhard J. Eisenzopf
Assistant Examiner—Vinh P. Nguyen
Attorney, Agent, or Firm—Philip W. Jones

[57] ABSTRACT

Tuning elements are mounted on a coplanar waveguide probe adapted to be used for on-wafer microwave noise measurement of integrated circuit devices. Each of the tuning elements is a capacitive varactor which is connected between a respective position on the input signal line of the probe and a respective capacitor to ground for the injection of bias voltage. The input signal line carries a gate voltage for the wafer device under test, and the differential voltage between the gate voltage and the bias voltage applied to the respective varactor determines the capacitance presented to the signal line by the varactor. The impedance of the signal line at the point where the probe contacts the wafer can be varied by adjusting the bias voltages applied to the varactors. The position at which each of the varactors is connected to the input signal line depends upon the wavelength of the input signal and is normally less than two wavelengths of the input signal from the end of the probe that contacts the wafer.

15 Claims, 4 Drawing Sheets

TUNABLE MICROWAVE WAFER PROBE

The invention relates to a device for introducing a controlled impedance microwave signal to the active devices on a microchip wafer for mapping the noise parameters of those devices, and more particularly, to a probe on which tunable varactors are mounted close to the wafer.

Microwave wafer probing has been developed for the measurement of small signal ('Scattering' or 'S') parameters on wafers of active microchip devices such as GaAs MESFETs. This measurement requires that only one impedance (usually 50 ohms) be imposed on the device under test. In I.E.E.E. Transactions on Electron Devices, Vol. ED-29, No. 7, July, 1982, Strid and Gleason described the wafer probe in common use today which consists of a tapered coplanar transmission line. The large end of the probe is connected to a coaxial connector and the small end is sized to match pads on the wafer devices under test. The probe must be mounted on a stable support structure ('probe station') to hold it steady relative to the wafer. In I.E.E.E. International Solid-State Circuits Conference, 1978, p. 172, Richard Q. Lane described an all-electronic tuner for supplying various impedances to a device under test in a coaxial medium to facilitate noise measurement. The tuner consisted essentially of a transmission line on which were mounted two varactors (in this text, the term varactor refers to a capacitive variable reactance element).

It is, in principle, possible to measure the noise properties of active microwave devices on a wafer by connecting a Strid probe to a Lane tuner. A difficulty with this arrangement is that, because of the mechanical configuration of a typical probe station, the probe and tuner must be connected by a long coaxial cable. Such cable has a typical characteristic impedance of 50 ohms, which does not match the impedance presented by the tuner; the mismatch creates an undesirable loss and reduces the bandwidth. One proposed solution to this difficulty is to build a miniature tuner and connect it directly to a probe. This invention relates to another solution, in which the probe itself is made tunable by means of capacitive varactors connected along the length of the probe.

There are several advantages to placing the tuning mechanism on the probe. The proximity of the tuner to the device under test allows for a test bandwidth (around a center frequency) to be wider than is possible with conventional techniques; the test bandwidth is sufficiently wide that Double Sideband (DSB) measurements can be done. Also, the matching impedance is automatically referenced directly to the input of the device, and errors associated with de-embedding test fixtures and wire bonds are avoided. Losses are reproducible and kept at a minimum, providing more repeatable measurements. A further advantage is that the probe calibration procedure is straightforward and relatively simple. Furthermore, the tunable probe is inexpensive and simple to construct; only two diodes and a decoupling network are required.

The invention is a tunable microwave coplanar waveguide probe for use in mapping the noise parameters on a wafer of devices to be used at microwave frequencies. The probe has a tip end adapted to contact the wafer and has support means for connecting the probe to a support structure for precise positioning of the probe relative to the wafer. The probe has an input signal line and at least one ground line extending from an electrical input connection on the probe to the tip end, the signal and ground lines at that tip end defining spaced electrical contacts. A first varactor mounted on the probe is electrically connected between a first position on the signal line and a first bias voltage line. A second varactor mounted on the probe is electrically connected between a second position on the signal line and a second bias voltage line. Each of the first and second bias voltage lines is connected to the at least one ground line through a respective first microwave frequency shorting means mounted on the probe. The first and second bias voltage lines extend off of the probe and are adapted to be electrically connected to first and second bias voltage sources respectively. The impedance on the input signal line at the tip end of the probe is adjusted by selective variation of the first and second bias voltages.

The first and second positions on the signal line may be spaced from each other by approximately 0.18 wavelengths of the input signal. The first and second positions on the signal line may be spaced from the tip end of the probe by less than two wavelengths of the input signal. At lower frequencies, the first and second positions on the signal line may be spaced from the tip end of the probe by less than one wavelength of the input signal. The input signal may have a frequency of approximately 6 GHz., the varactors may have a capacitance varying between approximately 0.4 and 1.6 picofarads, and each of the first microwave frequency shorting means may be a capacitor. The probe may broaden from the tip end toward the other end, the support means may be a metal mounting block at the other end of the probe, the portion of the probe extending from the mounting block to the tip end may be a non-conductive body, and the input signal line and the at least one ground line may be formed from gold deposited onto the surface of the non-conductive body. The input signal line may extend at a central position on the non-conductive body, and the at least one ground line may be a pair of regions each extending on an opposite side of the input signal line. The non-conductive body may be formed from alumina.

The probe may also comprise a pair of resistive elements and a pair of second microwave frequency shorting means mounted on the probe. In this form of the invention, each resistive element is positioned in a respective one of the first and second bias voltage lines such that the one end of the resistive element is electrically connected to a respective one of the varactors. Each second microwave frequency shorting means is connected between the at least one ground line and the other end of a respective one of the resistive elements. Each resistive element may be a resistor, and each second microwave frequency shorting means may be a capacitor.

The invention will next be described in terms of a preferred embodiment utilizing the accompanying drawings, in which.

Figure 1:
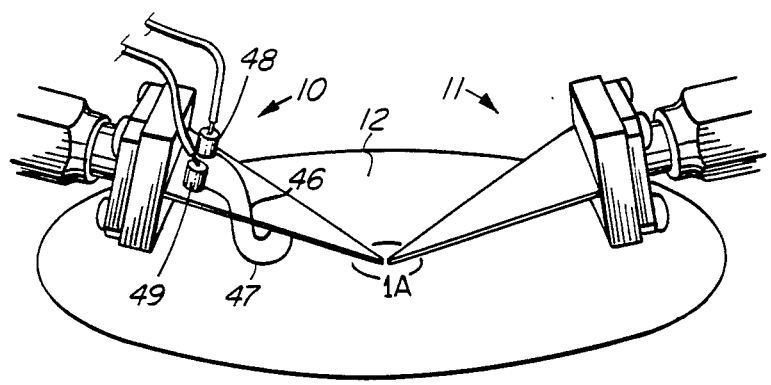
FIG. 1 is a perspective view of the tunable input probe of the invention, an untuned output probe, and a wafer bearing active devices under test.
Figure 1A:
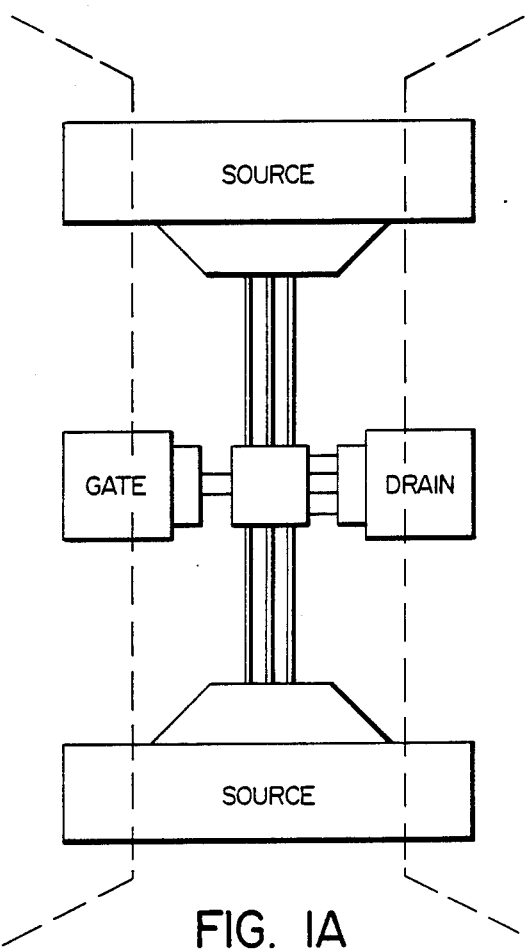
FIG. 1A is a plan view of one of the active devices under test on the wafer of FIG. 1, the dashed lines in this view illustrating the relative positions of the input and output probes relative to the active device.

The tunable input probe 10 and untuned output probe 11 are fixed to a support structure so as to remain steady relative to the wafer 12 comprised of active devices under test. The wafer 12 is automatically stepped through a series of positions relative to the support structure by computer-controlled equipment. At each position, one of the devices on the wafer is tested for a noise figure. A map of the noise figure for the devices on the wafer can be prepared from the results of the tests. The inset drawing of FIG. 1 is an amplification of a device, for instance a GaAs MESFET device, sitting on the wafer under probes 10 and 11. Each device has a series of pads adapted to be contacted by the probe tips. For calibration purposes, devices may also be formed on the wafer surface for connecting together the two probe lines, for shorting the lines, or for presenting a 50-ohm load on the lines. Such calibration devices may alternatively be placed on a separate wafer.

Figure 2:
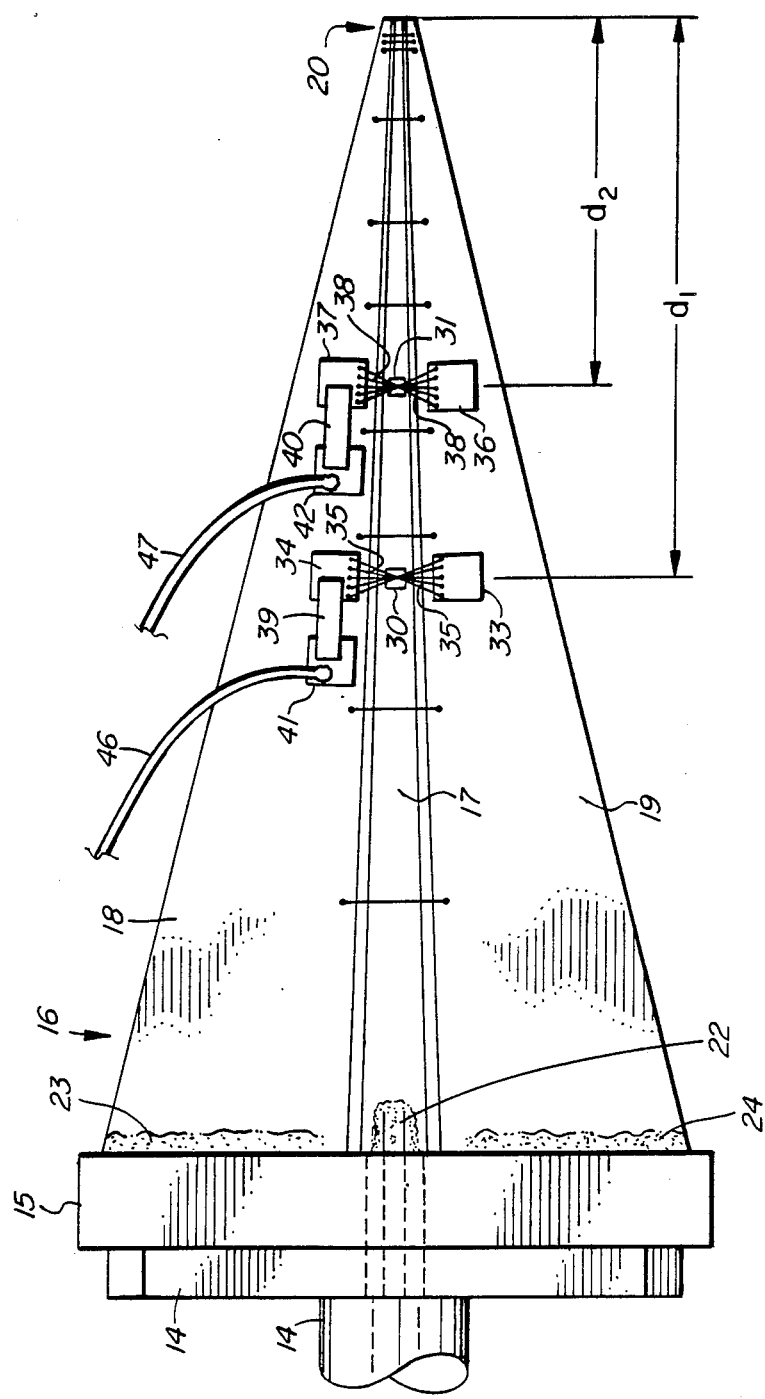
FIG. 2 is a plan view of the inderside of the tunable probe of FIG. 1, the view illustrating the general position of the tuner components relative to the tip end of the probe.
Figure 5:
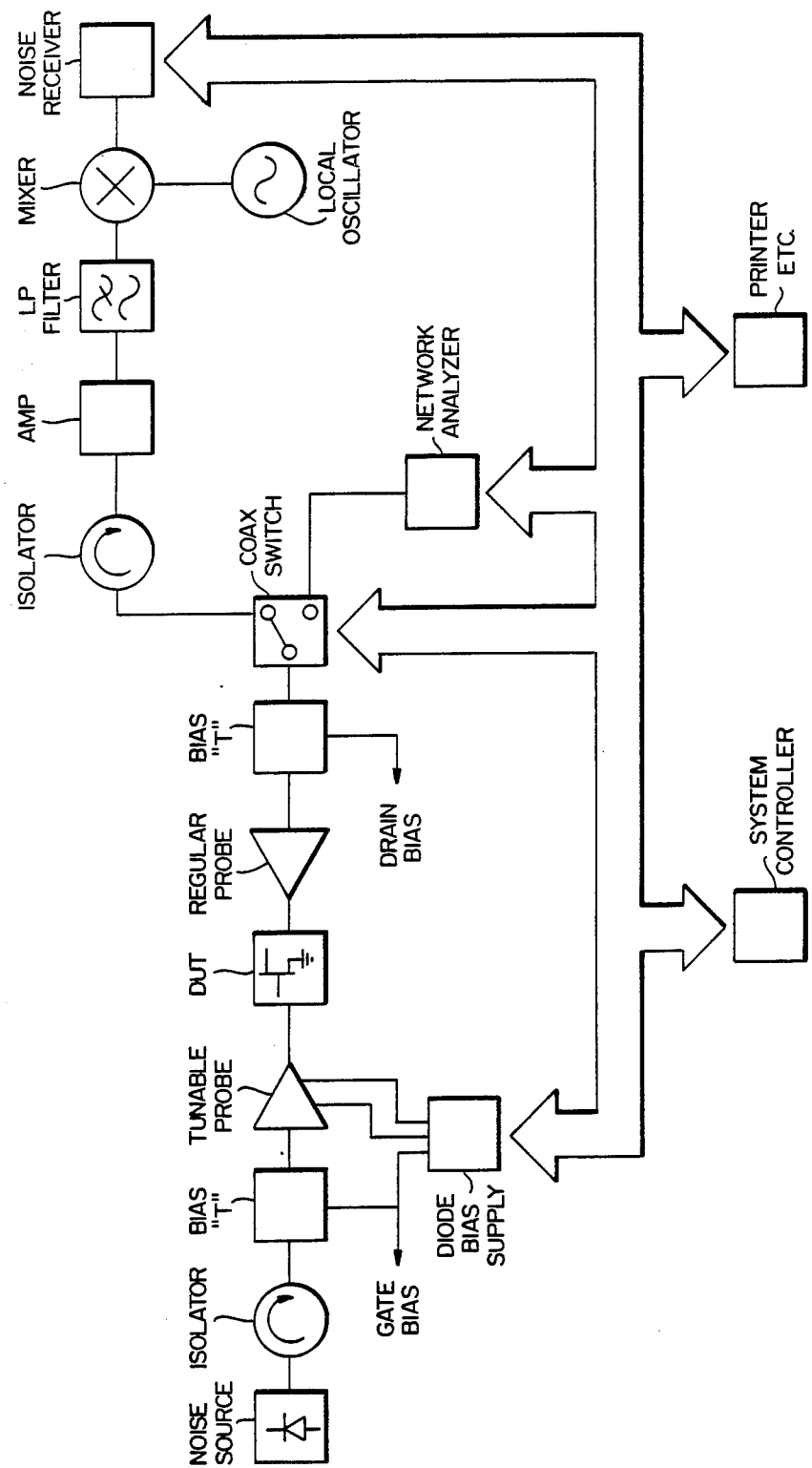
FIG. 5 is a block diagram of a Single Sideband noise figure measurement system.

FIG. 2 illustrates the underside of the tunable input probe 10. The probe is comprised of a SMA adaptor 14, a metal block 15 fastened to adaptor 14, and a tapered alumina member 16 connected to block 15. Adaptor 14 is used to connect the probe to a SMA connector, which allows simple insertion into, and removal from, the measurement system (which is schematically shown in FIG. 5). Gold is deposited on alumina member 16 to define an input signal line 17 and a pair of ground lines 18 and 19. The signal and ground lines define a coplanar waveguide having a characteristic impedance of 50 ohms. A pair of contacts adapted to transfer the input signal to the wafer 12 is formed by the deposition of nickel onto signal line 17 and ground lines 18 and 19 at the probe tip (which is generally, designated 20 in FIG. 2). The microwave input signal is transferred to input signal line 17 from SMA adaptor 14 by a solder connection 22, while solder connections 23 and 24 act both to transfer the signal ground to ground lines 18 and 19 and to structurally support alumina member 16 relative to block 15.

Figure 3:
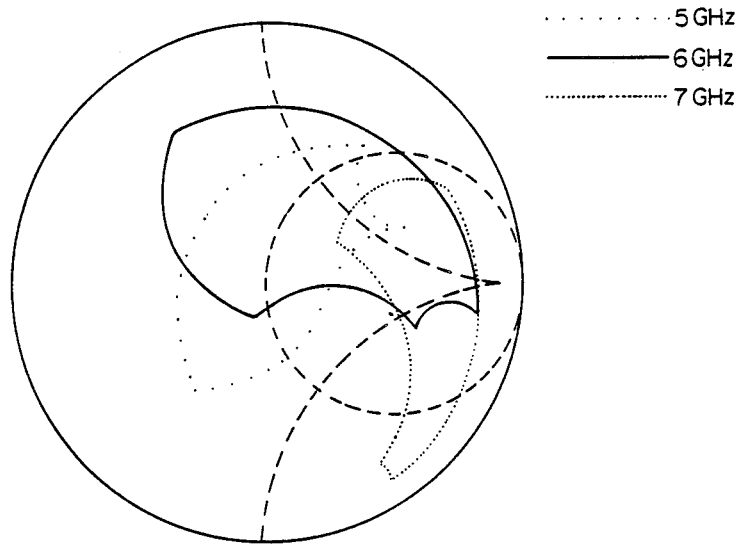
FIG. 3 is a Smith chart of the range of impedances presented at the tip end of a probe optimized for an input signal frequency of 6 GHz.

The tuning mechanism on the probe is comprised of a pair of capacitive semiconductor varactor diodes (hereafter called 'varactors') 30 and 31 bonded to input signal line 17 at distances $d_1$ and $d_2$ respectively from the tip of the probe. The varactors exhibit a capacitance which varies with the voltage applied across them. Connecting such varactors between the signal line and a voltage source provides a means for controlling the impedance of the signal line seen at the probe tip 20. In this embodiment, the position of the varactors was chosen to allow a large variation of impedance to be achieved at a given frequency, centred around the expected matching impedance, $Y_{opt}$ for a FET. FIG. 3 is a Smith chart of the range of impedances presented at the probe tip using a 6 GHz. input signal, a $d_1$ value of 0.53 wavelengths, a $d_2$ value of 0.35 wavelengths, and varactors with capacitance variable between 0.4 and 1.6 picofarads. As illustrated in FIG. 3, the two positions selected for the varactors allow for an approximate useful tuning range of 5 GHz. to 7 GHz.

The distance $d_2$ in FIG. 2 is determined by a trade-off between a pair of competing factors. One factor is the desire to place the varactor 31 as close to probe tip 20 as possible so as to cover a broad range of impedances. The competing factor is the physical dimension of varactor 31 compared to the width of signal line 17, which factor dictates that varactor 31 be positioned a certain minimum distance from probe tip 20. For noise measurements of a FET device at input frequencies less than 12 GHz., varactor 31 will generally be positioned on signal line 17 less than one wavelength of the input signal from probe tip 20; at greater than 12 GHz. varactor 31 will generally be positioned between one and two wavelengths from probe tip 20. For bipolar devices, varactor 31 will generally be positioned less than one wavelength from probe tip 20 for input frequencies less than 6 GHz., and will be positioned between one and two wavelengths from probe tip 20 for higher input frequencies. A distance between varactors 30 and 31 of 0.18 wavelengths has been found to give an optimum range of impedance values on the Smith chart irrespective of the input signal frequency or the type of device under test, ie. whether a FET device or a bipolar device. For a FET device under test at an input signal frequency of 6 GHz., a $d_2$ value of 0.35 wavelengths of the input signal gives an optimum range of impedance values.

With further reference to FIG. 2, the cathode terminal of varactor 30 contacts signal line 17, while the anode terminal is connected to one terminal of chip capacitors 33 and 34 by means of a series of wires 35. Similarly, the cathode terminal of varactor 31 contacts signal line 17, while the anode terminal is connected to one terminal of chip capacitors 36 and 37 by means of a series of wires 38. The other terminal of chip capacitors 33 and 36 are connected to ground line 19, while the other terminal of chip capacitors 34 and 37 are connected to ground line 18. Resistors 39 and 40 each connects the one terminal of a respective one of the chip capacitors 34 and 37 to the one terminal of a respective one of a further pair of chip capacitors 41 and 42 respectively. The other terminal of chip capacitors 41 and 42 are connected to ground line 18. The six chip capacitors, each of which has a capacitance of greater than ten times the capacitance of the varactors and each of which is bonded to the probe, act to decouple the direct-current bias circuitry from the microwave signal. In this embodiment, each of the chip capacitors was selected to have a capacitance of 1000 picofarads. Each of the resistors 39 and 40 was selected to have a value of 1000 ohms, although any value between approximately 100 ohms and 10000 ohms would be suitable. Each of a pair of wires 46 and 47 extends from the one terminal of a respective one of the capacitors 41 and 42 to a respective one of a pair of posts 48 and 49 on the upper surface of the probe (as shown in FIG. 1). Wires are connected from posts 48 and 49 to a diode bias supply (see FIG. 5) located off the probe. The diode bias supply is capable of producing a separate anode voltage on each of the varactors 30 and 31 relative to the gate bias which is present on signal line 17 of the probe. The voltage differential thereby created by the diode bias supply across each varactor determines the capacitance of the respective varactor and the impedance that is presented to the wafer by signal line 17.

Figure 4:
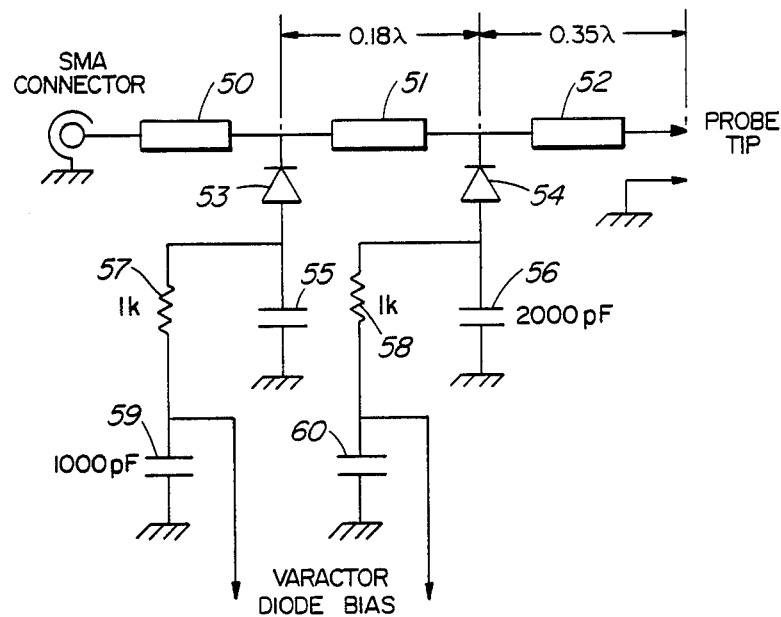
FIG. 4 is a circuit diagram of the tuner components of the tunable probe.

FIG. 4 is a circuit diagram of the tuner components of FIG. 2. In FIG. 4, the 50-ohm characteristic impedance of the signal line is designated by the symbols 50, 51 and 52. The varactors are designated by the symbols 53 and 54. The symbol 55 designates the total capacitance of capacitors 33 and 34, and the symbol 56 designates the total capacitance of capacitors 36 and 37. The resistors 39 and 40 are designated by the symbols 57 and 58, and the capacitors 41 and 42 are designated by the symbols 59 and 60.

The complete system used for noise parameter measurements is shown schematically in FIG. 5. The system is controlled by an HP9836 computer, and features an HP8510B network analyzer and an HP8970A noise figure meter (a piece of equipment which includes both a noise source and a means for measuring the amount of noise that passes through the system). A coaxial switch, controlled by the computer, is utilized to selectively transfer the output of the device under test (the DUT in FIG. 5) to either the network analyzer or the noise figure meter. Direct current voltages for operating the DUT are introduced into the system through the pair of Bias 'T's, one positioned on the input side of the tunable probe and the other positioned after the output probe. When used for double sideband measurements, the LP (low pass) filter in FIG. 5 may be eliminated. Interference is reduced by enclosing the entire probe system inside a grounded box, with direct current connections being made by means of low pass filter feedthroughs.

A three-step calibration procedure is used. First, the untuned output probe and network analyzer are calibrated to the tip of the probe using on-wafer open, short and 50-ohm load standards, and the one-port calibration kit built into the network analyzer. This calibration enables the accurate measurement of impedance on the wafer. Next, the two-port S-parameters of the tunable probe and connected bias 'T' are determined by measuring the S-parameters at the tip of the probe using the pre-calibrated untuned probe. An on-wafer through-line is used to make contact between the tunable probe and the output probe. The measurements are made over a range of varactor bias conditions, with the noise source and isolator being replaced by precision short, open and 50-ohm load standards. This step allows the combined available gain of the bias 'T' and tunable probe to be calculated under all bias conditions. That gain is multiplied by the Excess Noise Ratio (ENR) of the noise source to determine the effective ENR applied to the DUT. Typically, 7 different bias levels are applied to each varactor, ie. 49 different combinations. A measurement is also made, at each bias combination, of the impedance presented at the tip of the tunable probe when the noise source and isolator are connected. The final step of the calibration procedure involves calibrating the noise figure meter. This is achieved by connecting the noise source and tunable probe to the noise figure meter through the on-wafer through-line and the coaxial switch. The noise and gain parameters at all source impedances are measured, and the overall receiver noise and gain characteristics are then calculated using a least squares regression routine. Periodic verification of the calibration can be performed regularly using the on-wafer through-line.

Following calibration, the determination of the noise parameters of an active device such as a MESFET is a fully-automated process. After contacting the DUT with the tunable and output probes, the direct current bias is applied to those probes. A bias is then applied to each of the varactors to give an impedance at which the device is stable. The output impedance of the DUT is first determined using the network analyzer. Then the uncalibrated available gain and uncalibrated noise figure are measured using the noise figure meter. Both measurements are repeated at several different probe impedances (typically 9 or 16), each impedance resulting from a different pair of varactor biases. To avoid interpolation errors, the bias points selected for these measurements are a subset of the bias points used in the calibration stage. Once a complete set of measurements has been performed, the noise figure and available gain of the DUT are calculated for each impedance. The minimum noise figure, associated gain, optimum matching impedance ($Y_{opt}$) and noise resistance are determined by using a least squares regression routine. The time taken to obtain the noise parameters of a DUT at any given bias is determined by the number of averages made by the noise figure meter, and the number of impedances at which measurements are made. A typical measurement at nine impedances, with 64 averages per impedance, and the associated calculations using the least squares regression technique take approximately 90 seconds.

With the described probe and system, differences of only $+/-0.05$ dB. have been found in the noise figures for the same DUT measured on different occasions, and $+/-0.1$ dB. using different calibrations. The noise figures determined from on-wafer measurements using the tunable probe agree to within 0.1 dB. with the results obtained from mounted devices using a completely separate, mechanically-tuned system. A further indication of the accuracy of the system is that the agreement between the measured data points and the theoretically-fitted noise circles is generally within $+/-0.06$ dB. Similarly good agreement has also been observed for $Y_{opt}$, associated gain, and noise resistance. To ensure accuracy it is desirable to choose probe impedances close to $Y_{opt}$, as large mismatches tend to increase the measurement errors.

Because the tuning elements of the probe are located close to the DUT, the impedances presented to the DUT at both sideband frequencies is very similar. DSB measurements may therefore be performed, and those measurements have given similar results to SSB measurements. For example, at 6 GHz. with an intermediate frequency (IF) of 33 MHz. the DSB noise figure agrees to within $+/-0.05$ dB. with the SSB results produced with an IF frequency of 500 MHz.

I claim:

1. A tunable microwave coplanar waveguide probe for use in mapping the noise parameters on a wafer of devices to be used at microwave frequencies, the probe having a tip end adapted to contact the wafer and having support means for connecting the probe to a support structure for precise positioning of the probe relative to the wafer, the probe having an input signal line and at least one ground line extending from an electrical input connection on the probe to the tip and, the signal and ground lines at the tip end defining spaced electrical contacts, a first varactor mounted on the probe being electrically connected between a first position on the signal line and a first bias voltage line, a second varactor mounted on the probe being electrically connected between a second position on the signal line and a second bias voltage line, each of the first and second bias voltage lines being connected to the at least one ground line through a respective one of a pair of first microwave frequency shorting means mounted on the probe, the first and second bias voltage lines extending off of the probe and being adapted to be electrically connected to first and second bias voltage sources respectively, the impedance on the input signal line at the tip end of the probe being adjusted by selective variation of the first and second bias voltages.

2. A probe as in claim 1, wherein the first and second positions on the signal line are spaced from each other by approximately 0.18 wavelengths of the input signal.

3. A probe as in claim 2, wherein each of the first and second positions on the signal line are spaced from the tip end of the probe by less than two wavelengths of the input signal.

4. A probe as in claim 2, wherein each of the first and second positions on the signal line are spaced from the tip end of the probe by less than one wavelength of the input signal.

5. A probe as in claim 4, wherein the input signal has a frequency of approximately 6 GHz., wherein each of the varactors has a capacitance varying between approximately 0.4 and 1.6 picofarads, and wherein each of the first microwave frequency shorting means is a capacitor.

6. A probe as in claim 1, wherein the probe broadens from the tip end toward the other end, wherein the support means is a metal mounting block at the other end of the probe, wherein that portion of the probe extending from the metal mounting block to the tip end comprises a tapered non-conductive body, and wherein the input signal line and the at least one ground line are formed from gold deposited onto the surface of the non-conductive body.

7. A probe as in claim 6, wherein the input signal line extends at a central position on the non-conductive body, and wherein the at least one ground line is a pair of regions each extending on an opposite side of the input signal line.

8. A probe as in claim 6 or 7, wherein the non-conductive body is formed from alumina.

9. A probe as in claim 1, further comprising a pair of resistive elements and a pair of second microwave frequency shorting means mounted on the probe, each resistive element being positioned in a respective one of the first and second bias voltage lines such that the one end of the resistive element is electrically connected to a respective one of the varactors, each second microwave frequency shorting means being connected between the at least one ground line and the other end of a respective one of the resistive elements.

10. A probe as in claim 9, wherein each resistive element is a resistor and wherein each second microwave frequency shorting means is a capacitor.

11. A tunable microwave coplanar waveguide probe for use in mapping the noise parameters on a wafer of devices to be used at microwave frequencies, the probe comprising:
(a) a support portion for supporting the probe in a fixed position relative to the wafer;
(b) a structural portion extending from the support portion and having its outer end adapted to contact the wafer, the structural portion being formed from a non-conductive material, an input signal line and at least one ground line extending on the structural portion from an electrical input connection to the outer end;
(c) a pair of varactors mounted on the structural portion, the first end of each varactor contacting the input signal line;
(d) a pair of first capacitors mounted on the structural portion, each first capacitor extending between the at least one ground line and the second end of a respective one of the varactors; wherein the second end of each varactor is adapted to be connected to a respective one of first and second bias voltage sources, and wherein the impedance on the input signal line at the tip end of the probe can be varied by selective variation of the magnitude of the first and second bias voltages.

12. A probe as in claim 11, further comprising:
(e) a pair of resistors, each having its one end connected to a second end of a respective one of the varactors; and,
(f) a pair of second capacitors mounted on the structural portion, each second capacitor extending between the at least one ground line and the other end of a respective one of the pair of resistors; wherein the other end of each resistor is adapted to be connected to a respective one of first and second bias voltages sources, and wherein the impedance on the input signal line at the tip end of the probe can be varied by selective variation of the magnitude of the first and second bias voltages.

13. A probe as in claim 11 or 12, wherein each varactor contacts the input signal line at a respective position on the signal line spaced less than two wavelengths of the input signal from the outer end of the structural portion of the probe.

14. A probe as in claim 11 or 12, wherein each varactor contacts the input signal line at a respective position on the signal line spaced less than one wavelength of the input signal from the outer end of the structural portion of the probe.

15. A probe as in claim 1 or 11, wherein the varactor is a semiconductor varactor diode.

* * * * *

UNITED STATES PATENT AND TRADEMARK OFFICE
CERTIFICATE OF CORRECTION

PATENT NO. : 4,853,624
DATED : August 01, 1989
INVENTOR(S) : Gordon G. Rabjohn

It is certified that error appears in the above-identified patent and that said Letters Patent is hereby corrected as shown below:

In claim 1, line 59, "and" should read --end--

Signed and Sealed this

Nineteenth Day of June, 1990

Attest:

HARRY F. MANBECK, JR.

Attesting Officer

Commissioner of Patents and Trademarks